United States Patent
Pan et al.

(10) Patent No.: US 6,576,511 B2
(45) Date of Patent: Jun. 10, 2003

(54) METHOD FOR FORMING NITRIDE READ ONLY MEMORY

(75) Inventors: Samuel Pan, Hsin-Chu (TW);
Chia-Hsing Chen, Hsin-Chu (TW);
Chun-Jung Lin, Hsin-Chu (TW);
Minnie Hsiung, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/847,110

(22) Filed: May 2, 2001

(65) Prior Publication Data

US 2002/0164855 A1 Nov. 7, 2002

(51) Int. Cl.[7] .............................................. H01L 21/336
(52) U.S. Cl. ...................... 438/257; 438/276; 438/278; 438/512
(58) Field of Search ........................... 257/67, 70, 910; 438/257, 276, 278, 512

(56) References Cited

U.S. PATENT DOCUMENTS 5,170,227 A * 12/1992 Kaneko et al. ............. 438/512
5,538,906 A * 7/1996 Aoki ............................ 437/29
6,184,095 B1 * 2/2001 Lee et al. .................... 438/278
6,291,327 B1 * 9/2001 Li et al. ...................... 438/530
6,365,455 B1 * 4/2002 Su et al. ...................... 438/257

* cited by examiner

*Primary Examiner*—David Nelms
*Assistant Examiner*—Dao H. Nguyen
(74) *Attorney, Agent, or Firm*—Powell Goldstein Frazer & Murphy LLP

(57) ABSTRACT

A semiconductor substrate having a source/drain region is initially provided, wherein a channel is formed in the space between the source/drain region within the semiconductor substrate. Then the oxide-nitride-oxide layers are formed on the semiconductor substrate, wherein the nitride layer is a charge trapping layer. Afterward, an electrically conductive material layer such as a gate is formed on and overlays the oxide-nitride-oxide layers. Subsequently, the memory cell is programmed by ultraviolet light irradiation to increase the threshold voltage of the memory cell.

22 Claims, 3 Drawing Sheets

METHOD FOR FORMING NITRIDE READ ONLY MEMORY

BACKGROUND OF THE INVENTION

1. Field of the Invention

The present invention relates generally to a method for forming a memory, and more particularly to a method for a read only memory.

2. Description of the Prior Art

Recently, developments have included various techniques for increasing the density of integration of the semiconductor memory device and decreasing the voltage thereof. A memory is a semiconductor device used to store data or information, wherein the memory has a plurality of cells such as a plurality of memory units for storing the data or information. The memory cells are arranged within an array to connect with word line and bit line, so as to perform their function for reading or writing. There are two types of memory, one is random access memory (RAM) and another is read only memory (ROM). A random access memory is an array of latches, each with a unique address, having an addressing structure that is common for both reading and writing. Data stored in most types of RAM's is volatile because it is stored only as long as power is supplied to the RAM. A read only memory (ROM) is a circuit in which information is stored in a fixed, nonvolatile manner, that is, the stored information remains even when power is not supplied to the circuit.

By convention, the read only memories have various styles, which can be classed by different methods for storing information, such as a programmable read only memory (PROM) is one in which the information is stored after the device is fabricated and packaged, erasable programmable read only memories (EPROM) are programmable read only memory that can be completely erased and reprogrammed, electrically erasable programmable read only memories (EEPROM) and a mask read only memory (MROM). The mask read only memory is a device for programming a desired cell transistor by selectively implanting impurity ions into a channel region of the cell transistor in the course of fabricating the same. Once information is programmed, the information cannot be erased. Thus, it is a non-volatile memory.

A control gate and a floating gate have long been utilized for forming a memory. Electrons are moved onto or removed from the floating gate of a given memory cell in order to program or erase its state. The floating gate is surrounded by an electrically insulated dielectric. Since the floating gate is well insulated, this type of memory device is not volatile; that is, the floating gate retains its charge for an indefinite period without any power being applied to the device. Moreover, if enough electrons are so injected into the floating gate, the conductivity of the channel of the field effect transistor of which the floating gate is a part is changed. Hence, a control gate is coupled with the floating gate through a dielectric layer and acts as a word line to enable reading or writing of a single selected cell in a two-dimensional array of cells. One type of memory array integrated circuit chip includes elongated, spaced apart source and drain regions formed in a surface of a semiconductor substrate, wherein the source and drain regions form the bit lines of the memory. A two-dimensional array of floating gates has each floating gate positioned in a channel region between adjacent source and drain regions, while the control gate is positioned over each row of floating gates in a direction transverse to the source and drain regions, wherein the control gates are the word lines of the memory array.

If the read only memory has a structure, such as nitride layer, it is called nitride read only memory (NROM). There are two processes for fabricating the nitride read only memory (NROM) cells. In the first process, bit lines are first created in the substrate, after which the surface is oxidized. Following the oxidation, the ONO layers are added over the entire array. The word lines are then deposited with polysilicon in rows over the ONO layers. In the second process, the ONO layers are formed over the entire array first, on top of which conductive blocks of polysilicon are formed. The bit lines are implanted between the blocks of polysilicon after which the ONO layers are etched away from on top of the bit lines. Planarized oxide is then deposited between the polysilicon blocks after which polysilicon word lines are deposited.

FIG. 1, to which reference is made, illustrates a typical prior art nitride read only memory cell. This nitride read only memory cell includes a substrate 100 in which are implanted a source 110 and a drain 120 and on top of which lies an oxide-nitride-oxide (ONO) structure 130 having a layer of nitride 150 sandwiched between two oxide layers 140 and 160. On top of the ONO structure 130 lies a gate conductor 170. Between source 110 and drain 120 is a channel 180 formed under ONO structure 130. Nitride section 150 provides the charge retention mechanism for programming the memory cell. Specifically, when programming voltages are provided to source 110, drain 120 and gate conductor 170, electrons flow towards drain 120. According to the hot electron injection phenomenon, some hot electrons penetrate through the lower section of silicon oxide 140, especially if silicon oxide section 140 is thin, and are then collected in nitride section 150.

As shown in FIG. 1B, which is known in the art, nitride section 150 retains the received charge in a concentrated area adjacent drain 120. Concentrated charge 190 significantly raises the threshold voltage of the portion of the channel 180 of the memory cell under charge 190 to be higher than the threshold voltage of the remaining portion of the channel 180. When concentrated charge 190 is present (that is, the cell is programmed), the raised threshold voltage of the cell does not permit the cell to be placed into a conductive state during reading of the cell. If the concentrated charge 190 is not present, the read voltage on gate conductor 170 can overcome the much lower threshold and, accordingly, channel 180 becomes inverted and hence, conductive. Nevertheless, it is necessary to provide a large of voltage for programming of conventional read only memory, so as to overcome difference of potential energy that is very high. Therefore, the process complexity is increased and, hence, cost is increased.

In accordance with the above description, a new and improved method for forming the nitride read only memory is therefore necessary, so as to raise the yield and quality of the follow-up process.

SUMMARY OF THE INVENTION

In accordance with the present invention, a method is provided for fabricating the read only memory that substantially overcomes the drawbacks of the above mentioned problems which arise from the conventional methods.

Accordingly, it is a main object of the present invention to provide a method for fabricating the read only memory having a charge trapping dielectric sandwiched between two silicon dioxide layers. This invention can use exposure of high energy light for programming the memory, so as to accelerate sufficiently electrons at the high energy light irradiated region to inject into the region of the trapping dielectric layer. Hence, the present invention is appropriate for deep sub-micron technology to provide the semiconductor devices.

Another object of the present invention is to provide a method for forming the nitride read only memory. The present invention can define an array of memory cells to have binary threshold states. Furthermore, a non-high energy light-penetrable film is deposited and is patterned to define programming cell regions and non-programming cell regions for having binary threshold states. Hence, this invention can decrease differences of potential energy without higher voltage circuitry for electrical programming. Moreover, no program circuitry is required for nitride read only memory cell programming, so as to reduce process complexity and, hence, cost. Therefore, the present invention can provide positive economic effects.

In accordance with the present invention, a new method for forming semiconductor devices is disclosed. First of all, a semiconductor substrate that has a source/drain region is provided, and a channel is located in the space between the source/drain region within the semiconductor substrate, wherein the channel is a predetermined region for programming. Then the oxide-nitride-oxide layers are formed on the semiconductor substrate, wherein the nitride layer is a charge trapping layer. Afterward, an electrically conductive material layer as a gate is formed on and overlays the oxide-nitride-oxide layers. Subsequently, the memory cell is programmed by ultraviolet light irradiation to increase threshold voltage of the memory cell.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
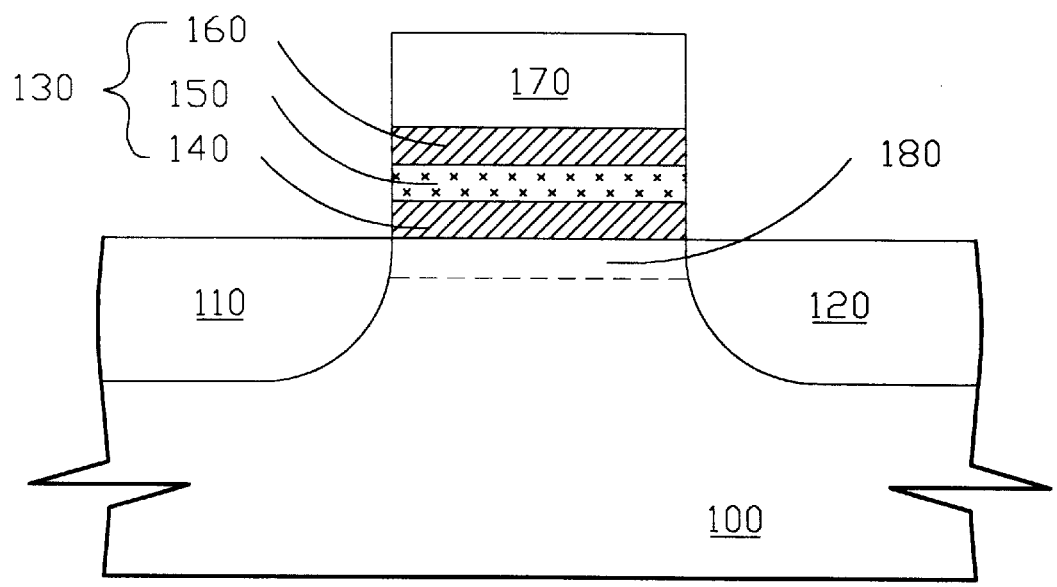
FIG. 1A and FIG. 1B show cross-sectional views illustrative of the nitride read only memory with the conventional process for programming.
Figure 1B:
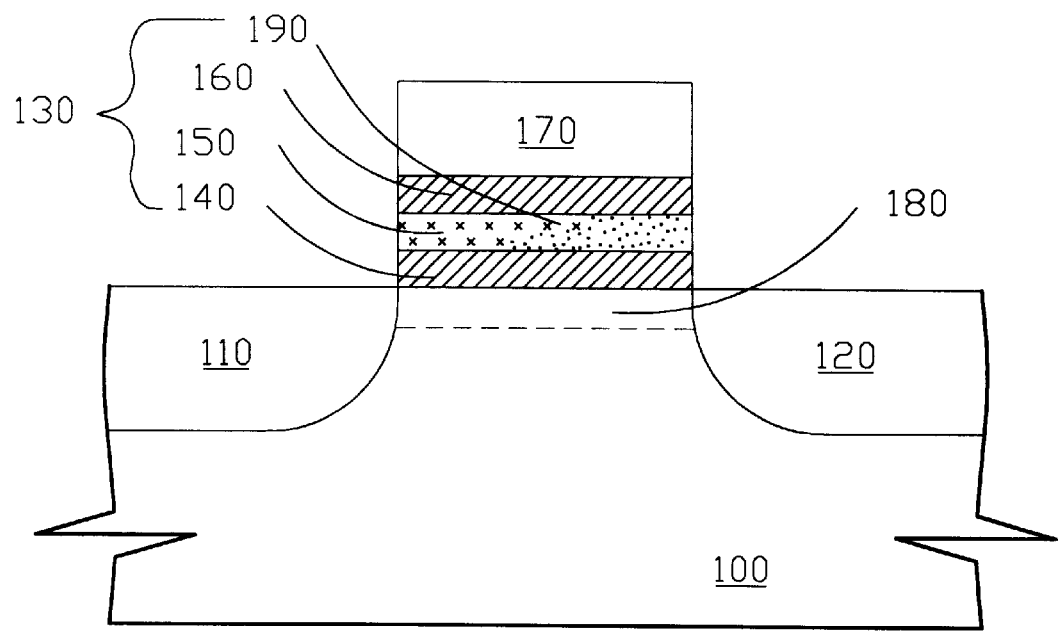
Figure 2A:
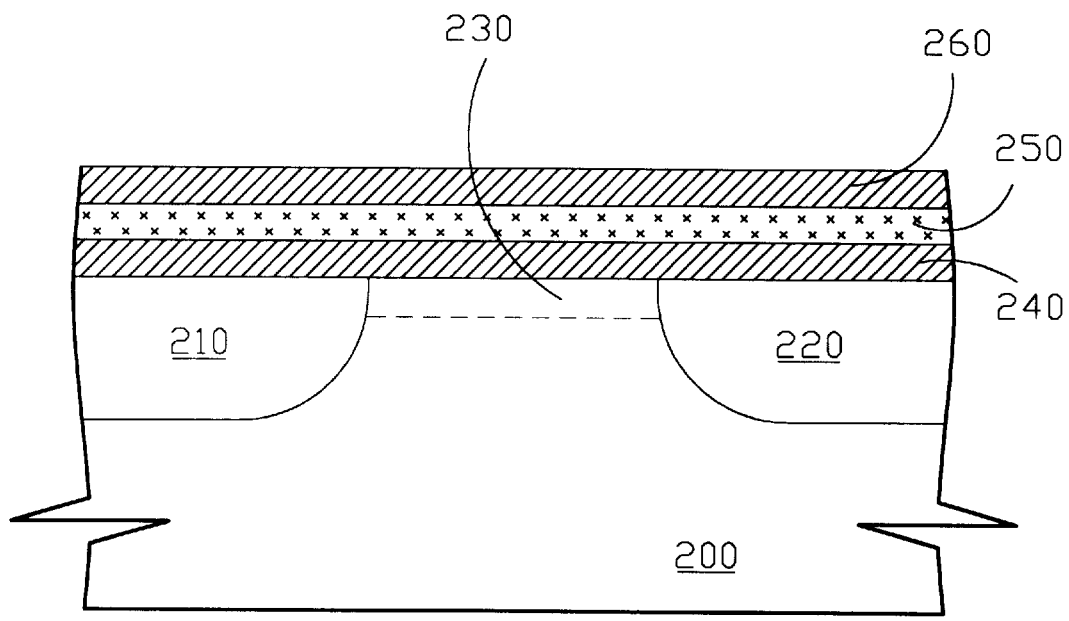
FIG. 2A and FIG. 2B show cross-sectional views illustrative of various stages for programming a read only memory with a high energy light in accordance with the first embodiment of the present invention.

As illustrated in FIG. 2A, in the first embodiment of the present invention, first of all, a semiconductor substrate 200 with the first conductivity is provided. Then a source region 210 and a drain region 220 with the second conductivity are formed in the semiconductor substrate 200 by a conventional ion-implant process, wherein the source region 210 and a drain region 220 are separated at a predetermined distance as a channel 230 from each other, the channel 230 is a predetermined region for programming. Next, a first isolated layer 240 is formed over the semiconductor substrate. 200. Afterward, a charge trapping is defined by layer 250 and is formed on the first isolated layer 240. Subsequently, a second isolated layer 260 is formed on the charge trapping dielectric layer 250.

Figure 2B:
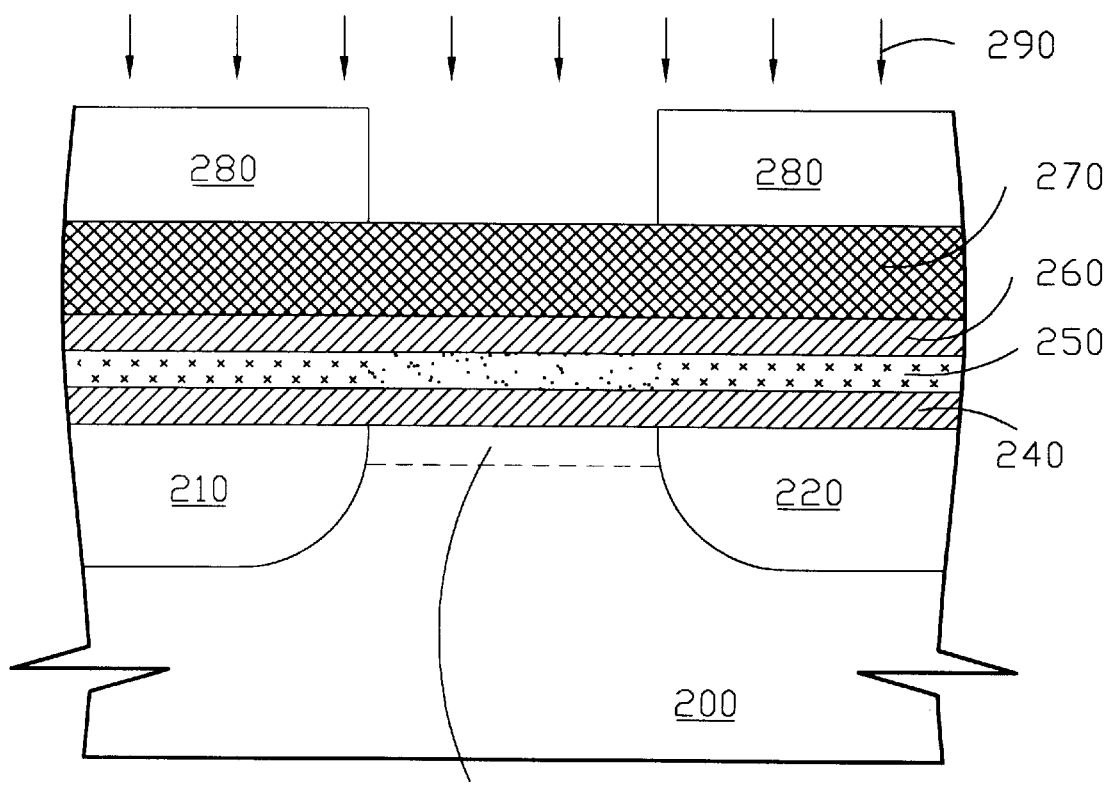

Referring to FIG. 2B, in this embodiment, forming a conductive layer 270 as a gate on the second isolated layer 260. Then forming and defining a photoresister layer 280 on the conductive layer 270 to expose the portion surface of conductive layer 270 that is located on the channel 230. The irradiation of a light 290 having a energy for activating electrons is performed by the photoresister layer 280 as a mask to program the cell, wherein the energy for activating electrons is about 3 eV to 9 eV. Finally, the photoresister layer 280 is removed.

Figure 3A:
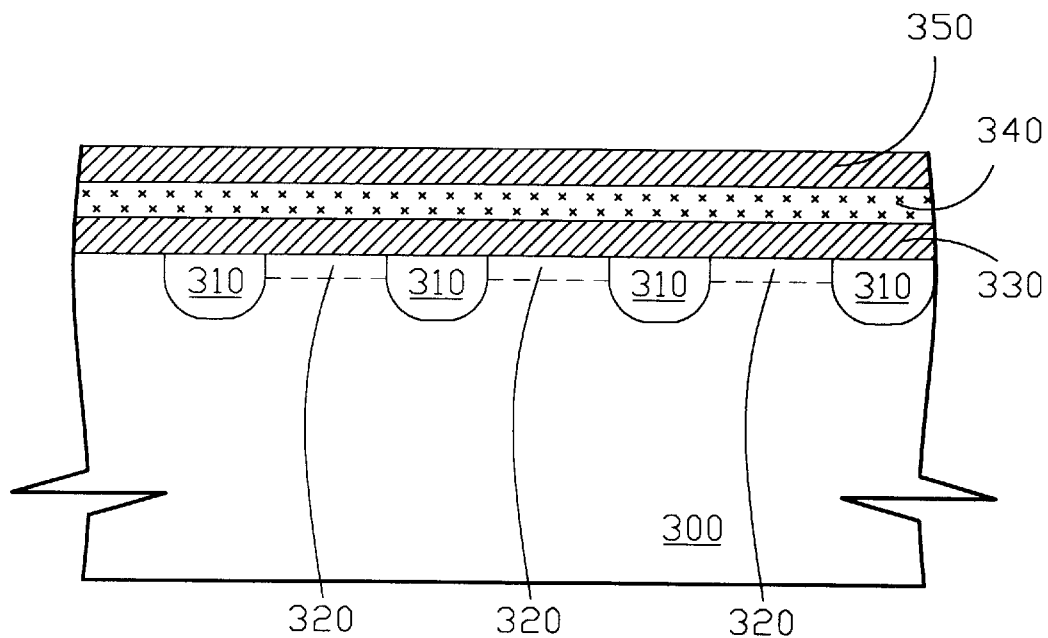
FIG. 3A and FIG. 3B show cross-sectional views illustrative of various stages for programming a nitride read only memory with an ultraviolet light in accordance with the second embodiment of the present invention.

As illustrated in FIG. 3A, in the second embodiment of the present invention, first of all, a semiconductor substrate 300 with the first conductivity is provided. Then plurality source/drain regions 310 with the second conductivity are formed in the semiconductor substrate 300 by the conventional ion-implant process, wherein the plurality of source/drain regions 310 are separate at a predetermined distance as a channel 320 from each other, wherein the channel 320 is a predetermined region for programming. Next, a first oxide layer 330 is deposited on the semiconductor substrate 300 and the plurality channels 320 thereof. Afterward, a nitride layer 340 is deposited on the first oxide layer 330, wherein the nitride layer 340 is a charge trapping dielectric layer. Subsequently, a second oxide layer 350 is deposited on the nitride layer 340.

Figure 3B:
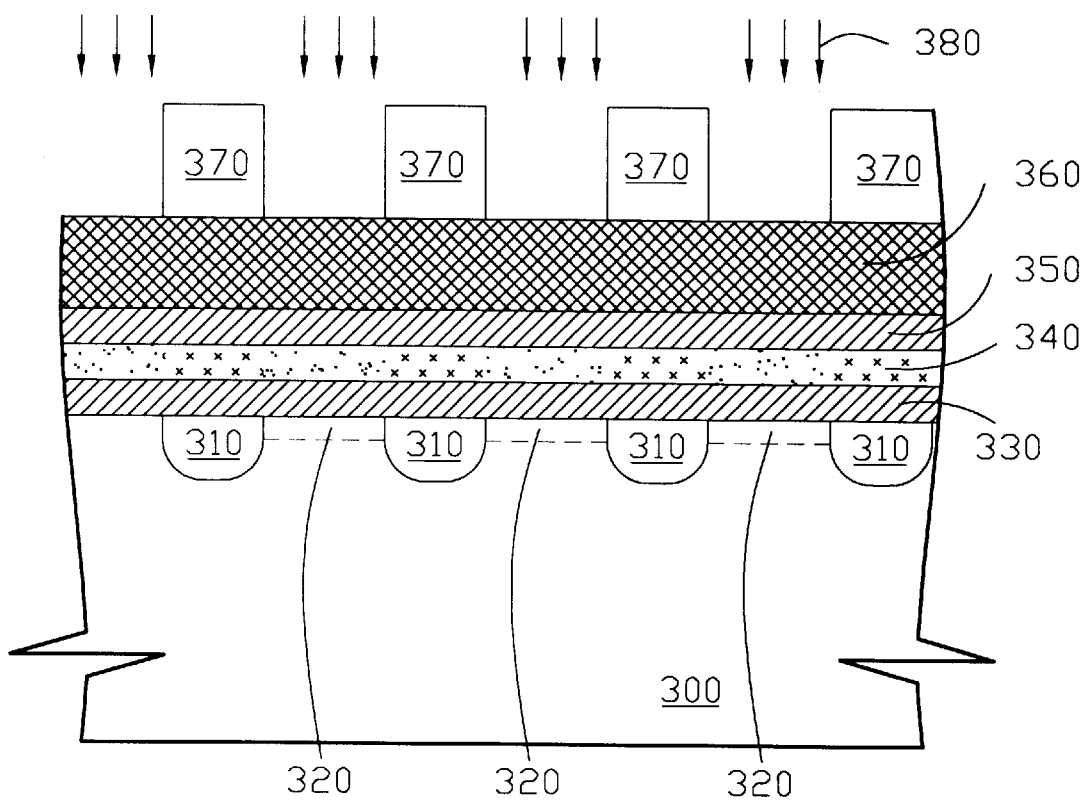

Referring to FIG. 3B, in this embodiment, a polysilicon layer 360 is deposited on the second oxide layer 350. A plurality of photoresister layers are formed and defined on the polysilicon layer 360 that are located on the plurality source/drain regions 310, so as to expose the portion surface of the polysilicon layer 360 that are located on the plurality channels 320. The irradiation of an ultraviolet light (UV) 380 is performed by the plurality photoresister layers 370 as plurality masks to program the cell, wherein the energy of the ultraviolet light (UV) 380 is about 3eV to 9eV. Finally, the plurality of photoresister layers 370 is removed.

In this embodiment of the present invention, as discussed above, the present invention can use exposure of high energy light for programming the memory, so as to accelerate sufficiently electrons at the high energy light irradiated region to inject into the region of the trapping dielectric layer. Thus, the present inventon can increase the quality of the process. Hence, the present invention is appropriate for deep sub-micron technology to provide the semiconductor devices. Furthermore, for example, one is programmed, while the other is at initial state.

Moreover, to define an array of memory cells to have binary threshold states, a non-high energy light-penetrable film is deposited and patterned to define programming cell regions and non-programming cell regions for having binary threshold states. Therefore, this invention can decrease the difference of potential energy without higher voltage circuitry for electrical programming. On the other hand, no program circuitry is required for nitride read only memory cell programming, so as to reduce process complexity and, hence, cost. In other words, the present invention can provide to positive economic effects.

Of course, it is possible to apply the present invention to the nitride read only memory process, and also it is possible to apply the present invention to any one read only memory in the semiconductor devices. Also, this invention can be applied to use light irradiation with high energy concerning the read only memory process used for programming memory cells have not been developed at present. The method of the present invention is the best read only memory compatible process for deep sub-micro process.

Obviously, many modifications and variations of the present invention are possible in light of the above teachings. It is therefore to be understood that within the scope of the appended claims, the present invention may be practiced other than as specifically described herein.

Although specific embodiments have been illustrated and described, it will be obvious to those skilled in the art that various modifications may be made without departing from what is intended to be limited solely by the appended claims.

What is claimed is:

1. A method for programming a memory, the method comprising:
    providing a semiconductor substrate having a source/drain region therein, wherein said source/drain region is separated at a predetermined region for programming from each other;
    forming a dielectric layer on said semiconductor substrate;
    forming a conductive layer on said dielectric layer;
    forming and defining a photoresist layer on said conductive layer that is located on source/drain region to expose a partial surface of said conductive layer that is located on said predetermined region for programming;
    irradiating said predetermined region for programming with a light having an energy for activating electrons by said photoresist layer as a mask to program said memory; and
    removing said photoresist layer on said conductive layer.

2. The method according to claim 1, wherein said predetermined region for programming comprises a channel.

3. The method according to claim 1, wherein said dielectric layer comprises a charge trapping layer.

4. The method according to claim 3, wherein the material of said charge trapping layer comprises a silicon nitride.

5. The method according to claim 1, wherein said light comprises a ultraviolet light.

6. The method according, to claim 1, wherein said energy for activating electrons is about 3 eV to 9 eV.

7. A method for programming a read only memory, the method comprising:
    providing a semiconductor substrate having a source/drain region therein, wherein said source/drain region is separated at a channel from each other;
    forming a first isolated layer on said semiconductor substrate;
    forming a charge trapping layer on said first isolated layer;
    forming a second isolated layer on said charge trapping layer;
    forming a conductive layer on said second isolated layer;
    forming and defining a photoresist layer on said conductive layer that is located on source/drain region to expose a partial surface of said conductive layer that is located on said channel;
    irradiating said channel with a light having an energy about 3 eV to 9 eV for activating electrons by said photoresist layer as a mask to program said read only memory; and
    removing said photoresist layer on said conductive layer.

8. The method according to claim 7, wherein said channel comprises a predetermined region for programming.

9. The method according to claim 7, wherein said semiconductor substrate comprises a first conductivity.

10. The method according to claim 7, wherein said source/drain region comprises a second conductivity.

11. The method according to claim 7, wherein the method for forming said first isolated layer comprises a deposition process.

12. The method according to claim 7, wherein the material of said first isolated layer comprises a silicon oxide.

13. The method according to claim 7, wherein the method for forming said charge trapping layer comprises a deposition process.

14. The method according to claim 7, wherein the material of said charge trapping layer comprises a silicon nitride.

15. The method according to claim 7, wherein the method for forming said second isolated layer comprises a deposition process.

16. The method according to claim 7, wherein the material of said second isolated layer comprises a silicon oxide.

17. The method according to claim 7, wherein the method for forming said conductive layer comprises a deposition process.

18. The method according to claim 7, wherein the material of said conductive layer comprises a polysilicon.

19. The method according to claim 7, wherein said light comprises a ultraviolet light.

20. The method according to claim 7, wherein said read only memory is programmed by way of the irradiating said predetermined region for programming with said light.

21. A method for programming a nitride read only memory, the method comprising:
    providing a semiconductor substrate having a first conductivity;
    forming a plurality of source/drain regions having a second conductivity in said semiconductor substrate, wherein said plurality of source/drain regions are separated at a plurality of channels from each other;
    depositing a first oxide layer on said semiconductor substrate to form a first isolated layer;
    depositing a nitride layer on said first oxide layer to form a charge trapping layer;
    depositing a second oxide layer on said nitride layer to form a second isolated layer;
    depositing a polysilicon layer on said second oxide layer to form a conductive layer;
    defining a plurality of photoresist layers on said polysilicon layer that are located on said plurality of source/drain regions and exposing a portion surface of said polysilicon layer that are located on said plurality of channels to form a plurality of predetermined regions for programming;
    irradiating said plurality of predetermined regions for programming with an ultraviolet light by said plurality of photoresist layers as masks to program said nitride read only memory; and
    removing said plurality of photoresist layers on said polysilicon layer to form said nitride read only memory.

22. The method according to claim 21, wherein said ultraviolet light comprises a energy about 3 eV to 9 eV.

* * * * *